United States Patent
Guo et al.

(10) Patent No.: US 6,606,273 B1
(45) Date of Patent: Aug. 12, 2003

(54) METHODS AND SYSTEMS FOR FLASH MEMORY TUNNEL OXIDE RELIABILITY TESTING

(75) Inventors: Xin Guo, Mountain View, CA (US);
Nian Yang, San Jose, CA (US);
Zhigang Wang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 12 days.

(21) Appl. No.: 10/121,140

(22) Filed: Apr. 11, 2002

(51) Int. Cl.$^7$ .............................. G11C 7/00; G11C 14/06
(52) U.S. Cl. .............. 365/201; 365/185.24; 365/185.28
(58) Field of Search ........................... 365/201, 185.24, 365/185.28, 185.33, 185.29, 185.14, 185.26

(56) References Cited

U.S. PATENT DOCUMENTS

| | | | |
|---|---|---|---|
| 5,122,985 A | * | 6/1992 | Santin .................... 365/185.19 |
| 5,132,935 A | * | 7/1992 | Ashmore, Jr. ........... 365/185.19 |
| 5,636,168 A | | 6/1997 | Oyama |
| 5,757,204 A | | 5/1998 | Nayak et al. |
| 6,060,895 A | | 5/2000 | Soh et al. |

\* cited by examiner

*Primary Examiner*—Thong Q. Le
(74) *Attorney, Agent, or Firm*—Eschweiler & Associates, LLC

(57) ABSTRACT

Methods are disclosed for determining tunnel oxide reliability of flash memory devices in a wafer prior to sorting and packaging without damaging or stressing the devices. The methods comprise measuring an initial threshold voltage of a test cell having the same tunnel oxide as other flash cells on the wafer, applying an erase stress to the test cell for a first time period and a program stress to the test cell for a second time period, and measuring the final threshold voltage of the test cell. The difference between the initial and final threshold voltages is then used to determine or estimate the tunnel oxide reliability of the flash memory cells on the wafer.

21 Claims, 6 Drawing Sheets

METHODS AND SYSTEMS FOR FLASH MEMORY TUNNEL OXIDE RELIABILITY TESTING

FIELD OF INVENTION

The present invention relates generally to semiconductor device fabrication and more particularly to testing tunnel oxide reliability in flash memory devices.

BACKGROUND OF THE INVENTION

Nonvolatile memory is becoming popular in modern electronic devices where data retention is needed when the devices are powered down. Nonvolatile memories include electrically programmable read-only memory (EPROM) and electrically-erasable programmable read-only memory (EEPROMs), wherein a large number of memory cells are constructed having an electrically isolated gate, referred to as a floating gate. A control gate is formed above the floating gate and isolated therefrom for operating the cell in program, erase, verify, and read operations. Data is stored in the memory cells in the form of charge on the floating gates. Electrical charge is provided to or removed from the floating gates by program and erase operations, respectively.

Another type of non-volatile memory is flash memory which is a derivative of EPROM and EEPROM. Unlike EPROM and EEPROM devices, certain types of flash memory can be reconfigured by erasure or reprogramming inside a system, without requiring special voltages for such reconfiguration. Flash memory devices are also generally lower in cost and available in higher densities than EEPROM. As a result, flash memory is becoming popular in a number of applications such as personal computers and peripherals, telecommunication switches, cellular phones, and internetworking, instrumentation and automotive devices, and emerging consumer-oriented voice, image and data storage products such as digital cameras, digital voice recorders, personal digital assistants (PDAs), and the like.

Such flash memory are commonly erased and reprogrammed in multiple-cell groups referred to as blocks. In modern floating gate flash memory cells, a program operation generates channel hot electrons (CHE) which are transported into the floating gate, causing an increase in the threshold voltage of the cell, which can subsequently be detected by reading the cell. A flash memory cell is typically programmed by applying a relatively high voltage to a control gate, grounding the source, and applying a predetermined voltage to the drain, where the drain potential is higher than that of the source. This generates vertical and lateral electric fields along the length of the channel from the source to the drain. These fields in turn cause electrons to be drawn off the source, which accelerate toward the drain, gaining energy along the way.

Electrons which achieve a certain energy level are able to jump over the potential barrier of the tunnel oxide and into the floating gate. These electrons become trapped in the floating gate which is surrounded by insulators (e.g., an interpoly dielectric between the floating gate and the control gate, and the underlying tunnel oxide). This trapping of electrons in the floating gate causes an increase in the threshold voltage of the cell, thereby programming the cell. The increase in the cell threshold voltage can then be detected during a read operation to ascertain the data stored in the cell.

In a read operation, a predetermined gate voltage is applied to the control gate, which is greater than the threshold voltage of an unprogrammed or erased cell, but less than the threshold voltage of a programmed cell, while a voltage is applied between the source and the drain. The current through the channel is measured and compared with a reference current to determine whether the cell has been programmed or not. If the measured current is above the reference value, then the cell has not been programmed (e.g., representing a first logic state such as a binary "0"). Alternatively, if the cell current is below the reference amount, then the cell has been programmed (e.g., thus representing a second logic state, such as a binary "1").

Flash cell erasure typically involves a Fowler-Nordheim tunneling effect, wherein electrons pierce through the tunnel oxide material between the floating gate and an underlying channel. In this way electronic charge is removed from the floating gate of a memory cell, thereby restoring the cell threshold voltage to the original (e.g., "unprogrammed" value). Various techniques are possible for erasing flash memory cells. One flash erasure technique involves applying a relatively high positive voltage to the source while the control gate is held at ground potential or connected to a negative voltage, and the drain is allowed to float. This generates a strong electric field across the tunnel oxide between the floating gate and the source. The electrons that are trapped in the floating gate undergo Fowler-Nordheim tunneling through the tunnel oxide to the source. In a channel-erase technique, a positive voltage is applied to the substrate beneath the channel, such as a P-well, and a relatively large negative voltage is applied to the control gate while the source and drain are allowed to float. This causes a large field between the gate and the substrate, resulting in Fowler-Nordheim tunneling of electrons from the floating gate through the tunnel oxide and into the channel.

Both the channel hot electron effect during flash memory programming operations along with the Fowler-Nordheim tunneling effect during erase operations cause degradation of the charge retention reliability of flash memory devices. The transfer of electrons into and out of the floating gate stresses the tunnel oxide material between the floating gate and the underlying channel. In the manufacture of flash memory devices, it is desirable to characterize the quality of the tunnel oxide to ensure that finished flash memory devices will operate properly for a certain number of data programming and erasure operations.

Toward that end, testing of samples is commonly done, in which sample memory devices are taken from lots of packaged memory devices and subjected to testing operations to ascertain the reliability of the tunnel oxide material therein. To illustrate such testing, FIG. 1 shows a conventional flash memory testing procedure 2, wherein samples are subjected to 100,000 program and erase cycles at an elevated temperature. A semiconductor wafer is processed at 4 to form flash memory devices therein, wherein many such devices are fabricated in individual die sections of the wafer according to known flash memory manufacturing techniques. Following processing of the flash memory wafer at 4, individual device dies are separated or singulated at 6 and packaged at 8. Thereafter at 10, a test device is selected from the packaged memories and a threshold voltage or voltages associated with the one or more memory cells in the test device is measured at 12 prior to program/erase operation cycling.

At 14, the temperature of the test device is elevated to 90 degrees C. and a program test operation is performed. The program operation at 14 involves programming one or more cells corresponding to the initial threshold voltage measurement at 12, using programming conditions similar to those encountered in normal operation of the device. Thereafter, the programmed cell or cells are erased at 16, again using erase conditions similar to normal erase operations at an elevated temperature of 90 degrees C. A counter is checked at 18 to ascertain whether 100,000 program/erase cycles have been performed. If not (NO at 18), the count is incremented at 20, and the programming and erasure of the target cell(s) is repeated at 14 and 16. The process continues in this fashion until the target cell in the test device has been programmed and erased 100,000 times (YES at 18), at which time the device is baked at 22.

Following the simulation of 100,000 program and erase cycles at 14–20 above, the final threshold voltage of the test device is measured at 24, and a threshold voltage shift is calculated at 26 by computing the difference between the measured initial (e.g., pre-stress) and final (e.g., post-stress) threshold voltages from steps 12 and 24, respectively. This threshold voltage shift is used to characterize the effect of 100,000 program and erase cycles to the part, so as to quantify the charge retention reliability of other (e.g., non-selected) flash memory devices fabricated in the same wafer (e.g., or production lot) as the test device. The threshold voltage shift is compared to an acceptance value at 28, and if the acceptance value is exceeded (YES at 30), the production lot of packaged parts is rejected at 30 and the test device is discarded at 34 before the test procedure ends at 36. However, if the threshold voltage shift computed at 26 is less than the acceptance value (NO at 28), the production lot is deemed acceptable at 32 and the test device is discarded at 34.

In such test procedures, it is noted that the test device is stressed by the test itself, resulting in the test device being discarded at 34 regardless of whether the test is passed or failed. Furthermore, the conventional test procedure 2 is performed following device sorting, separation, and packaging operations. Thus, where it is determined at 28 that the test device threshold voltage shift exceeded the allowable amount, the cost and time involved in sorting, separating, and packaging the devices in the rejected wafer or lot is wasted. Moreover, the typical cyclical program/erase test process (e.g., such as procedure 2 of FIG. 1) may take days or even weeks to complete. In the interim between packaging of the test device, and completion of the program/erase testing 2, many thousands of parts may be produced which may ultimately be scrapped when the testing is finished. Thus, there is a need for improved test methods and systems by which flash memory device testing may be performed, by which process scrap may be reduced and by which testing time may be shortened.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The present invention relates to methods and systems for flash memory device testing, by which the reliability of such devices may be measured or estimated. The invention involves test methodologies for ascertaining the reliability of flash memory cell tunnel oxide, in which program and erase stresses are applied to a flash memory cell and a threshold voltage shift is determined. Unlike prior techniques such as those described above, the methods of the present invention may be carried out in a fraction of the time required previously, and may be performed while the individual memory devices are still part of a wafer. Thus, the invention may be employed to provide early indication of process anomalies associated with flash memory devices, such as deficiencies in tunnel oxide, by which the costs associated with sorting, separating, and packaging deficient devices may be mitigated or avoided. Furthermore, the invention may be employed in a non-destructive manner, wherein tunnel oxide reliability may be ascertained without stressing tested production parts.

One aspect of the invention provides a method for testing tunnel oxide reliability of flash memory devices, comprising measuring an initial threshold voltage associated with a flash memory cell, and applying a first stress to a tunnel oxide of the flash memory cell for a first time period, which is equivalent to an integer number N erase operations. The method further comprises applying a second stress to the tunnel oxide of the flash memory cell for a second time period, equivalent to N program operations. A final threshold voltage is then measured and the tunnel oxide reliability is determined for flash memory devices in the same wafer or production lot as the test cell according to the initial and final threshold voltages.

The first and second stresses may be applied by connecting terminals of a test cell in a wafer to certain voltages for the first and second time periods so as to provide equivalent hot carrier and Fowler-Nordheim charge fluence through the tunnel oxide without the need to cycle the part through repeated test cycles. In this manner, the test may be completed in seconds or fractions thereof as opposed to days or weeks required using conventional test methodologies. In addition, the methods of the invention may advantageously be carried out at room temperature, whereas prior techniques required elevated temperatures for the repeated program/erase cycles. Other aspects of the invention involve systems for testing flash memory reliability.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
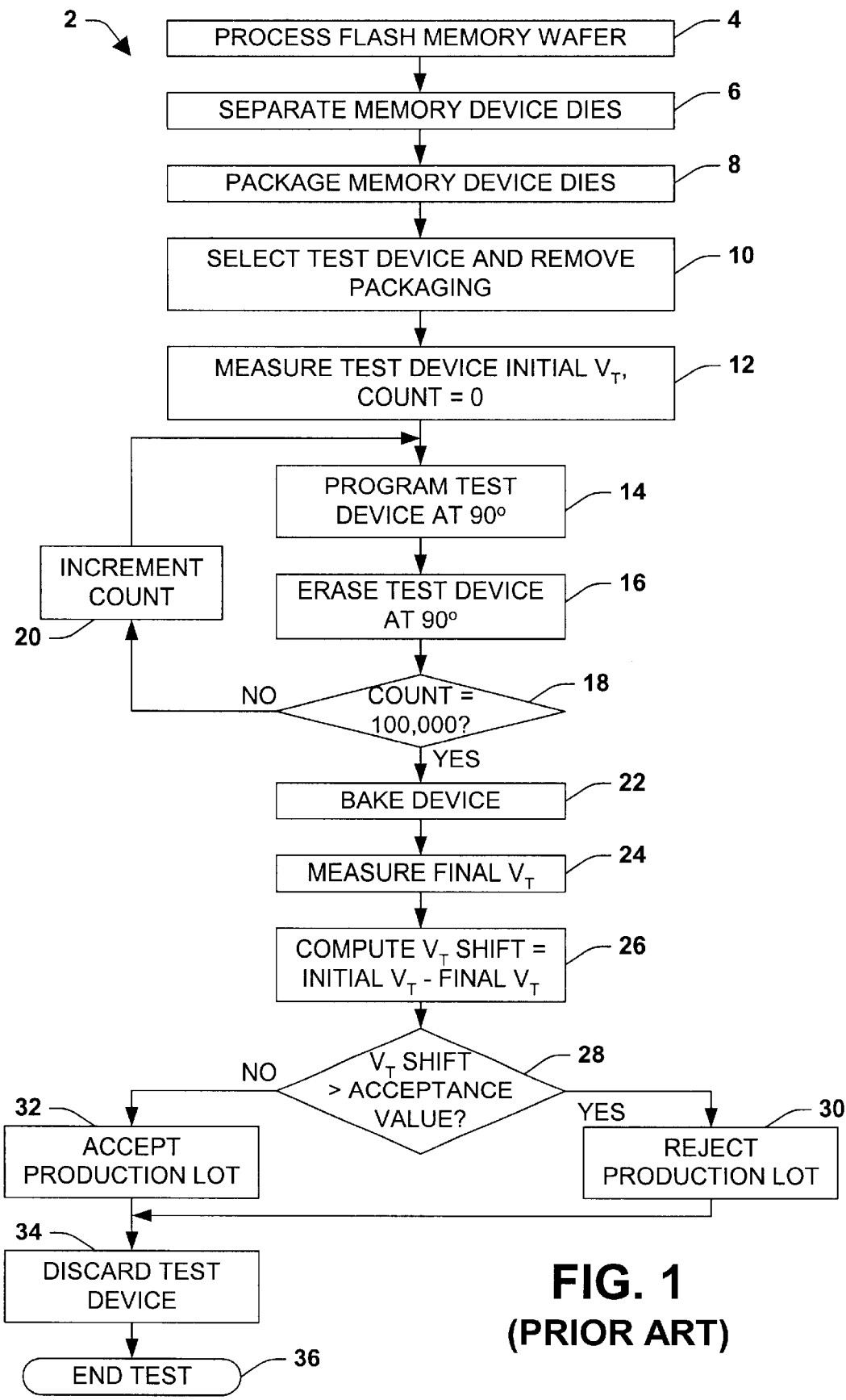
FIG. 1 is a flow diagram illustrating a conventional test procedure for testing flash memory devices.

The present invention will now be described with reference to the drawings wherein like reference numerals are used to refer to like elements throughout. The invention relates to methods and systems for testing tunnel oxide reliability of flash memory devices in a semiconductor wafer which may be employed to reduce scrap and testing time associated with conventional methods such as method 2 of FIG. 1 above. An exemplary implementation of the invention is illustrated and described hereinafter with respect to flash memories employing channel-erase techniques, in which the stress effects of repeated programming and erasure operations have a more pronounced effect on the tunnel oxide near the cell drain compared with the cell source.

Equivalent stresses are applied through application of various terminal voltage conditions for certain time periods which provide stresses to the tunnel oxide which may be correlated to those of the repeated program/erase style tests, where the test is completed in a fraction of the time. It will be appreciated, however, that the invention is not limited to employment in association with the specific cell types illustrated and described herein, and that the systems and methods of the invention may be employed in association with other flash memory devices apart from those specifically illustrated and described herein, for example, such as multi-bit flash memory cell architectures.

Figure 2:
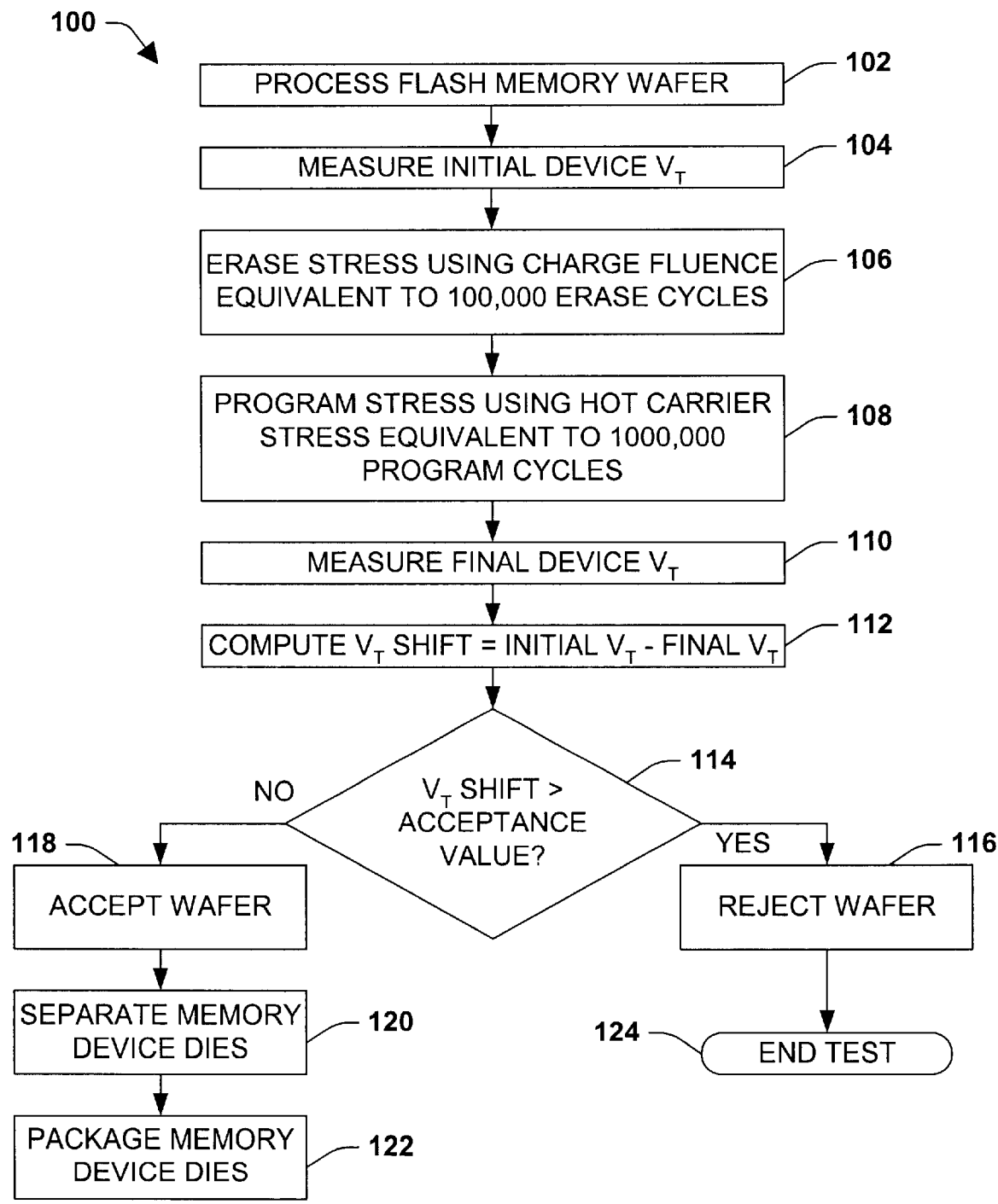
FIG. 2 is a flow diagram illustrating an exemplary method of testing flash memory device tunnel oxide reliability in accordance with the present invention.

FIG. 2 illustrates an exemplary method 100 of testing reliability of flash memory devices in accordance with the present invention. While the method 100 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

The method 100 begins at 102 with processing of a flash memory wafer, which may include a plurality of individual device die areas in which flash memory devices are fabricated. With the wafer still a unitary whole (e.g., prior to device sorting, separation, or packaging) and prior to any test stresses, an initial threshold voltage associated with a flash memory cell in the wafer is measured at 104. The flash memory cell to be tested may be a dedicated test cell fabricated with the same tunnel oxide as cells in the devices ultimately intended for finished products. In one example illustrated and described below, the test cell may be fabricated in the scribe line portions of the wafer between adjacent active device die areas, such that testing of the test cell provides an indication of the reliability of the tunnel oxide in the production cells of the wafer, without stressing the actual production cells and without occupying valuable active device area real estate.

At 106, a first stress is applied to a tunnel oxide of the flash memory test cell for a first time period. In one implementation, the first stress is applied to the test cell for about 400 ms to emulate the erase related charge fluence of about 100,000 erase cycles, such as including Fowler-Nordheim charge transfer effects thereof. Any integer number N of such erase cycles may be emulated at 106 in accordance with the invention, for example, whereby tests may be performed using stresses equivalent to 200,000, 500,000, or 1 million cycles. In this manner, the invention may be used as a metric to accept or reject production parts, and/or to predict end-of-life performance of parts during production and/or during process development and evaluation. In the illustrated example, the application of the first stress for the first time period is equivalent to an integer number N erase operations where N is 100,000 and the first time period is about 400 ms. The first time period may be increased to emulate stress equivalent to a larger number of erase cycles.

As described further below with respect to FIG. 4, the application of the first stress at 106 may be performed by applying a positive erase substrate voltage to the wafer substrate and applying a negative test voltage to a gate of the test cell for the first time period. The negative test voltage may be advantageously determined on a wafer by wafer basis, or on a test cell by test cell basis in accordance with another aspect of the invention. In this manner, the charge fluence (e.g., the current density times the first time period) resulting from the application of the negative test voltage can be correlated to that of the number N of erase cycles to be emulated at 106.

In one example, the negative test voltage is set to a voltage at which a current through a capacitor of known area on the semiconductor wafer equals a first current value, where the capacitor is formed using a tunnel oxide equivalent to tunnel oxide of the flash memory cell. Thus, a test capacitor may be formed near the test cell, for example, in the scribe line region of the wafer, for use in determining the negative test voltage to be applied to the test cell gate at 106. In this case, a positive erase substrate voltage such as about 9.3 volts is applied to the substrate and a negative voltage is applied to the capacitor. The negative capacitor voltage is varied while the current through the capacitor is monitored. Once a current through the capacitor equals a first current value corresponding to the current density experienced in the flash cells in normal erase operations (e.g., about −0.5 A/cm$^2$ in one example), the voltage is recorded by the test system. In the illustrated example, this negative test voltage is about −8 volts, for instance −8 volts +/−20%.

Once the negative test voltage has been determined, the negative test voltage is applied to the gate of the test flash cell, together with application of the positive erase substrate voltage (e.g., about 9.3 volts, such as 9.3 volts +/−20%) to the substrate for the first time period. In this manner, the equivalence of the charge fluence during testing is calibrated according to the actual tunnel oxide found in the devices on the wafer, wherein the number N of erase cycles to be emulated is correlated by adjusting the first time period during which time the erase stress is applied. For instance, in the illustrated example 100,000 erase cycles worth of erase stress (e.g., charge fluence through the tunnel oxide) can be applied in about 400 ms.

At 108, a second stress is applied to the test cell for a second time period, which emulates N program operations (e.g., 100,000 in the illustrated example). As with the first stress at 106, the number of program operations emulated by the second stress at 108 can be varied by changing the second time period, wherein 100,000 program operations corresponds to a second time period of about 100 ms. The second stress at 108 provides hot carrier charge transfer through the tunnel oxide equivalent to N cycles through application of appropriate voltages to the terminals of the test flash cell. In this example, the second stress is implemented by applying a positive program drain voltage to the test cell drain, applying a positive program gate voltage to the gate, and grounding the source for the second time period.

In this example, the drain is held at about 4.25 volts (e.g., 4.25 volts +/−20%) and the gate is set to about 5.5 volts (e.g., 5.5 volts +/−20%) for 100 ms to emulate 100,000 program operations. It is noted at this point that the test voltages applied at 106 and 108 may vary from product to product within the scope of the present invention, and that the specific values provided herein are exemplary in nature and not limiting of the appended claims. Thus, for example, the drain voltage applied at 108 in the illustrated method 100 is about 4.25 volts (e.g., 4.25 volts +/−20%) for one generation of technology illustrated and described herein, as determined by the actual voltage used in one product. Different testing conditions may be employed for different product generations in accordance with the invention, for instance, wherein the test conditions are related to actual operating parameters used in a given device technology.

It is also noted that the erase and program stresses at 106 and 108, respectively, are applied for less than 1 second for the illustrated example, to provide tunnel oxide stress to the test cell equivalent to 100,000 erase/program cycles. In this regard, the application of this stress using the conventional method 2 of FIG. 1 has been found to take several days or as much as a few weeks. Thus, the present invention can be employed to make tunnel oxide reliability testing virtually a real-time operation, whereas the prior techniques can not. As a result, any defects or anomalies in the flash memory processing at 102 can be identified before further wafers are processed without significantly impacting the processing throughput of a fabrication facility. Furthermore, sorting and packaging costs can be saved by early detection of tunnel oxide deficiencies by employment of the test methods of the invention to identify such problems at probe before the individual device dies are separated from the wafer. It is further noted that the erase and program stresses at 106 and 108 above may be applied in any order in accordance with the present invention.

At 110 the final (e.g., post-stress) threshold voltage for the test cell is measured and a threshold voltage shift is computed at 112 as the difference between the initial and final threshold voltages measured at 104 and 110, respectively. Thereafter, the tunnel oxide reliability for flash memory devices in wafer is determined according to the initial and final threshold voltages. At 114, the threshold voltage shift is compared to an acceptance value representative of a threshold voltage shift corresponding to an acceptable tunnel oxide degradation for flash memory devices in the semiconductor wafer after N erase operations and N program operations (e.g., N=100,000 in the illustrated method 100).

Based on the comparison at 114, the flash memory devices in the wafer under test are selectively rejected at 116 if the threshold voltage shift is greater than the acceptance value (YES at 114) and the test ends at 124. Otherwise (NO at 114), the wafer is accepted at 118. Thereafter, the individual memory device dies are separated from the wafer at 120 and packaged at 122, wherein it is noted that the exemplary method 100 advantageously avoids the costs of sorting and packaging devices which are rejected. The exemplary method 100, moreover, illustrates application of program and erase stresses to emulate a fixed number of program/erase cycles, which may be used to test a variety of flash memory devices and types. It is further noted that the exemplary method 100 may be carried out at room temperature, whereas the conventional method 2 of FIG. 1 involves elevating the device temperature to 90 degrees C. during program/erase cycling.

Figure 3A:
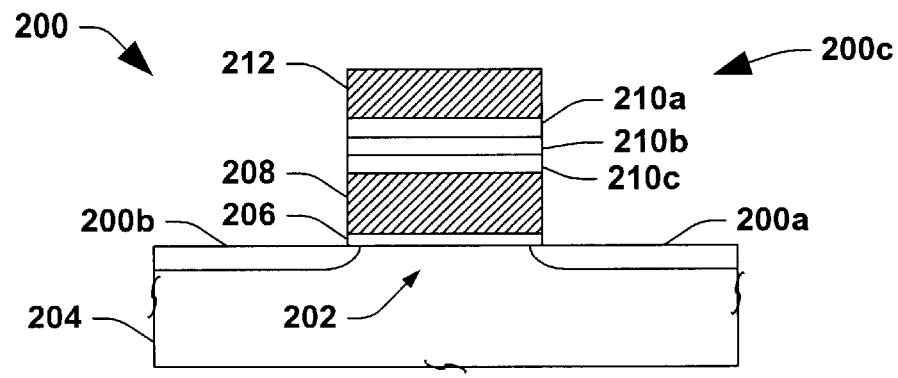
FIG. 3A is a partial side elevation view in section illustrating an exemplary flash memory cell in association with which various aspects of the invention may be carried out.

Referring to FIGS. 3A–3E, in one example, the invention may be employed in testing flash memory cells employing a channel-erase technique, although it will be understood that the invention may be used in testing devices beyond those illustrated and described herein. FIG. 3A illustrates an exemplary flash memory cell 200 comprising a source 200b, a drain 200a, and a channel 202 in a substrate or P-well 204, with a stacked gate structure 200c overlying the channel 202. The stacked gate 200c includes a thin gate dielectric layer or tunnel oxide 206 formed on the surface of the P-well 204. The stacked gate 200c also includes a polysilicon floating gate 208 which overlies the tunnel oxide 206 and an interpoly dielectric layer 210 overlying the floating gate 208. The interpoly dielectric layer 210 comprises a multilayer insulator such as an oxide-nitride-oxide (ONO) layer having two oxide layers 210a and 210c sandwiching a nitride layer 210b. A polysilicon control gate 212 overlies the interpoly dielectric layer 210. The channel 202 of the cell 200 conducts current between the source 200b and the drain 200a in accordance with an electric field developed in the channel 202 by the stacked gate structure 200c.

Figure 3B:
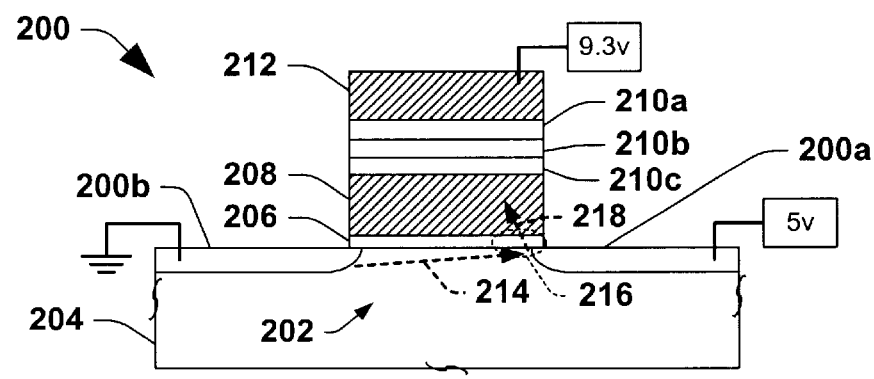
FIG. 3B is a partial side elevation view in section illustrating a program operation in the flash memory cell of FIG. 3A.

As illustrated in FIG. 3B, the cell 200 may be programmed by applying a relatively high voltage such as 9.3 volts to the control gate 212, connecting the source 200b to ground, and connecting the drain 200a to a predetermined potential above the source 200b, for example, 5 volts. These voltages generate a vertical and lateral electric field along the length of the channel 202 from the source 200b to the drain 200a. This electric field causes electrons to be drawn off the source 200b and to accelerate toward the drain 200a, illustrated by the arrow 214 in FIG. 3B. As these electrons move along the length of the channel 202, some acquire enough energy to jump over the potential barrier of the tunnel oxide 206 in a region 216 thereof and into the floating gate 208 through channel hot electron (CHE) effects, as illustrated by arrow 218 in FIG. 3B. These electrons become trapped therein, since the floating gate 208 is surrounded by the interpoly dielectric 210 and the tunnel oxide 206. As a result of the trapped electrons, the threshold voltage of the cell 200 increases, which causes the cell to be programmed.

Figure 3C:
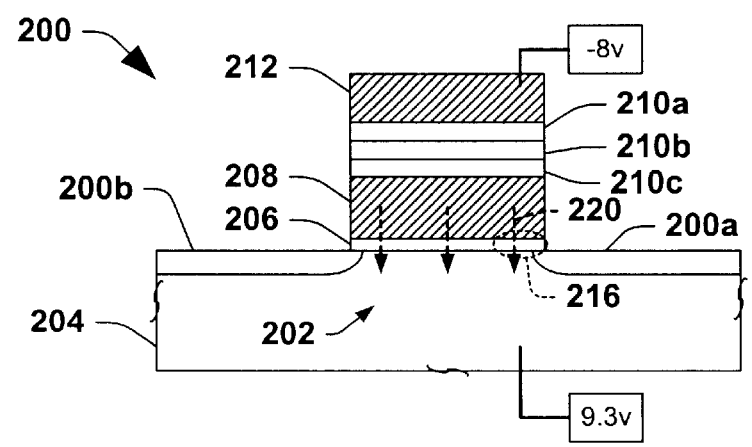
FIG. 3C is a partial side elevation view in section illustrating a channel-erase operation in the cell of FIGS. 3A and 3B.

Referring to FIG. 3C, the flash memory cell 200 is illustrated being erased using a channel-erase technique, wherein a positive voltage, for example, 9.3 volts, is applied to the substrate 204 beneath the channel 202. A negative voltage, for example, about −8 volts is applied to the control gate 212 while the source 202b and drain 202a are floated. This creates a large field between the floating gate 208 and the substrate 204, resulting in Fowler-Nordheim tunneling of electrons out of the floating gate 208 through the tunnel oxide 206 and into the channel 202, as illustrated by the arrows 220 in FIG. 3C. As can be seen in FIGS. 3B and 3C, the tunnel oxide 206 in region 216 is thus subjected to degradation due to both channel hot electron migration during programming and Fowler-Nordheim electron tunneling during erase operations. These effects degrade the charge retention reliability of the device 200 through stresses to the tunnel oxide material 206, which the test methodologies of the present invention can emulate, for example, using the exemplary method 100 of FIG. 2.

Figure 3D:
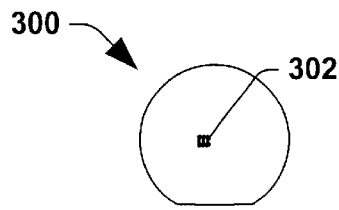
FIG. 3D is a top plan view illustrating a flash memory device wafer in which various aspects of the invention may be carried out.
Figure 3E:
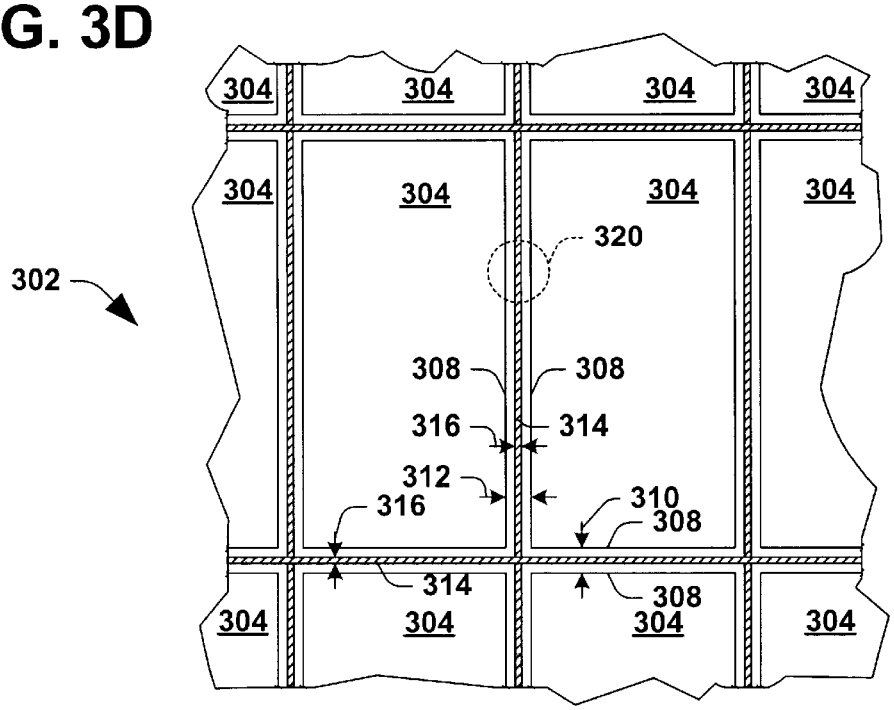
FIG. 3E is a fragmentary top plan view of a portion of the wafer of FIG. 3D illustrating individual device dies therein and scribe line regions therebetween.

FIGS. 3D and 3E illustrate a semiconductor wafer 300 in which flash memory devices, such as the exemplary cell 200, are produced, wherein a portion 302 of the wafer 300 is illustrated in FIG. 3E. The illustrated portion 302 of the wafer 300 includes a plurality of die areas 304 having generally rectangular boundaries 308 within which individual flash memory devices are formed in the wafer 302, wherein the die areas 304 are spaced vertically and horizontally by spacings 310 and 312, respectively. Scribe lines or channels 314 are subsequently saw cut into the spacings 310 and 312 to separate the individual dies 304 from the wafer 302, wherein the scribe lines have a width 316. Thus, the scribe line regions between the individual device dies 304 are sacrificed during die separation. In another aspect of the invention, the scribe line regions between the device dies 304, such as the exemplary region 320 in FIG. 3E, may be advantageously employed during wafer testing of the flash memory tunnel oxide reliability, by the formation of test monitors or devices therein, which are subsequently sacrificed during die separation.

Figure 4:
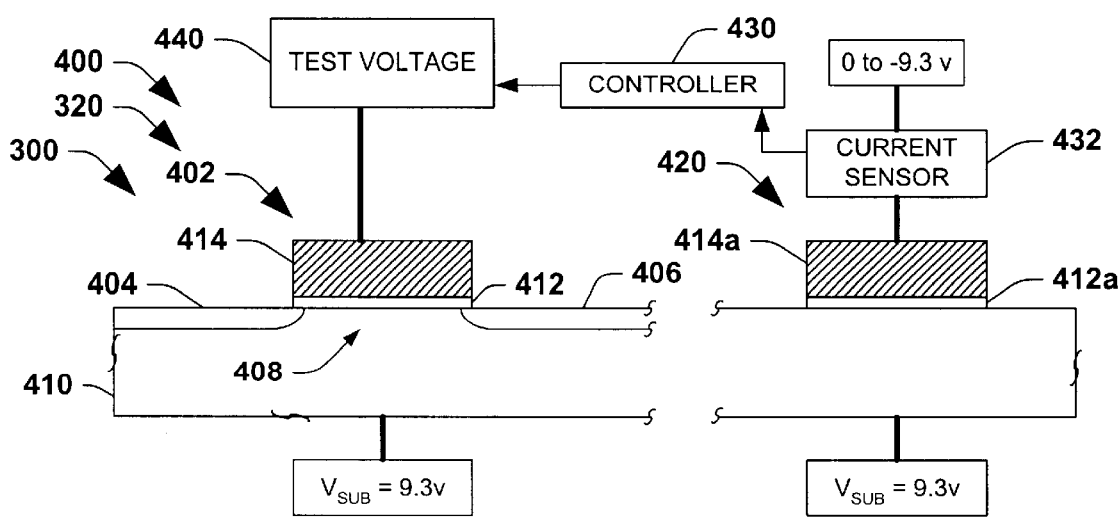
FIG. 4 is a partial side elevation view in section illustrating a system for testing tunnel oxide reliability of flash memory devices in accordance with another aspect of the invention.

Referring now to FIG. 4, the invention provides for the use of test devices in the scribe line regions of the flash memory device wafers, which are formed using the same tunnel oxide formation processes employed in fabricating the active region flash memory cells. These are then subjected to stresses to emulate an integer number N programming and erasure cycles as described above. The applied stresses and their effects upon the test structures may then be correlated with degradation expected for the flash cells in the wafer in order to estimate or ascertain the expected reliability of the tunnel oxide in the flash cells in the devices prior to die separation. In this manner, if a defect is found, the wafer can be scrapped without incurring further cost associated with sorting, separating, and packaging the individual devices thereof.

Although the test devices illustrated and described hereinafter with respect to FIG. 4 are advantageously formed in the scribe line regions between active device die areas in a wafer 300, it will be appreciated that such test structures may alternatively be formed in the active device areas in accordance with the invention. However, it is noted that locating the test structures in the sacrificial scribe line regions of the wafer allows utilization of the active die regions thereof for devices to be included in the final flash memory device products without negatively impacting final device density thereof.

A system 400 is illustrated in FIG. 4 for testing tunnel oxide reliability of flash memory devices in a wafer 300, comprising a test cell 402 with a source 404, a drain 406, and a channel 408 formed in the substrate 410 in the scribe line region 320 of the wafer 300. A tunnel oxide 412 is formed over the channel region 408, using the same processing steps employed in forming the tunnel oxide of flash memory devices in the active die regions 304 (e.g., tunnel oxide 206 of FIGS. 3A–3C). Similarly, a polysilicon floating gate structure 414 is formed over the tunnel oxide 412 using the same deposition processing used to form the floating gates (e.g., floating gate 208) of flash cells in the die areas 304. In addition to the test cell 402, a test capacitor 420 is formed in the region 320 having a tunnel oxide portion 412a and a floating gate portion 414a, having a known area. The capacitor 420 is formed near the test cell 402 (e.g., in the scribe line area 320 of the wafer 300), for example, having a known area of about 100 um$^2$.

The system 400 further comprises a test circuit including a controller 430, a current sensor 432, and voltage sources to apply various voltages to the test cell 402 and the test capacitor 420. As described above with respect to the application of an erase stress (e.g., step 106 of the exemplary method 100 in FIG. 2), the test system may be employed following fabrication of the flash memory devices in the wafer 300 to measure an initial threshold voltage of the test cell 402. For example, the voltage at the floating gate 414 is swept from 0 to about 4.5 volts while the substrate current is measured, with the source 404 grounded and the drain held at about 0.5 to 0.6 volts. When the current reaches a known value, for example 20 uA, the corresponding gate voltage is stored in the controller 430 as the initial (e.g., pre-stress) threshold voltage, wherein the current value of 20 uA may be selected to correspond to a verify current level used in the memory device cells in the wafer 300.

Once the initial threshold voltage is ascertained, the test system holds the substrate 410 near the capacitor to a voltage $V_{SUB}$ of about 9.3 volts (e.g., 9.3 volts +/−20%) while sweeping a voltage on the polysilicon 414a of the capacitor 420 from 0 volts to about −9.3 volts while measuring the capacitor current using the current sensor 432. The controller determines the voltage (e.g., a test voltage about −8 volts, such as −8 volts +/−20% in one exemplary implementation) at which a predetermined current density is achieved, for example, about −0.5 A/cm$^2$ corresponding to the current density normally found in flash memory cells in the wafer 300 during erase operations. Thereafter, the determined test voltage 440 is applied to the polysilicon gate 414 of the test cell 402 with the substrate held at about 9.3 volts (e.g., 9.3 volts +/−20%) and the source 404 and drain 406 floating for a first time period, such as about 400 ms, in order to emulate erase stress associated with 100,000 erase cycles.

Thus, the test system of FIG. 4 operates to apply an erase stress to the tunnel oxide 412 of the test cell 402, which is equivalent to an integer number N erase operations, wherein the number N may be varied by changing the first time period during which the stress is applied. It is noted in this regard, that the capacitor 420 allows the charge fluence during erase stress application to be calibrated according to the actual tunnel oxide 412, 412a formed in the devices 402, 420, which is the same as that used in forming the flash memory devices elsewhere in the wafer 300.

Thereafter, the controller applies various voltages to the terminals of the test cell 402 to emulate N program cycles as described above with respect to step 108 of the method 100. For example, the drain 406 is held to about 4.25 volts (e.g., 4.25 volts +/−20% in one example), the source 404 is grounded, and a test voltage of about 5.5 volts (e.g., 5.5 volts +/−20%) is applied to the gate 414 to emulate a program operation, wherein these voltage are applied for a second time period to emulate N program operations or cycles. For example, the program stress may be applied for about 100 ms corresponding to N=100,000 program cycles, wherein further cycles may be emulated by extending the second time period. Thereafter, the final (e.g., post-stress) threshold voltage is measured in the test cell 402, which is then used to selectively accept or reject the devices in the wafer 300.

For instance, the difference between the initial and final threshold voltages may be computed and compared with an acceptance value to decide whether the tunnel oxide in the flash memory cells of the wafer 300 is reliable or not.

Figure 5A:
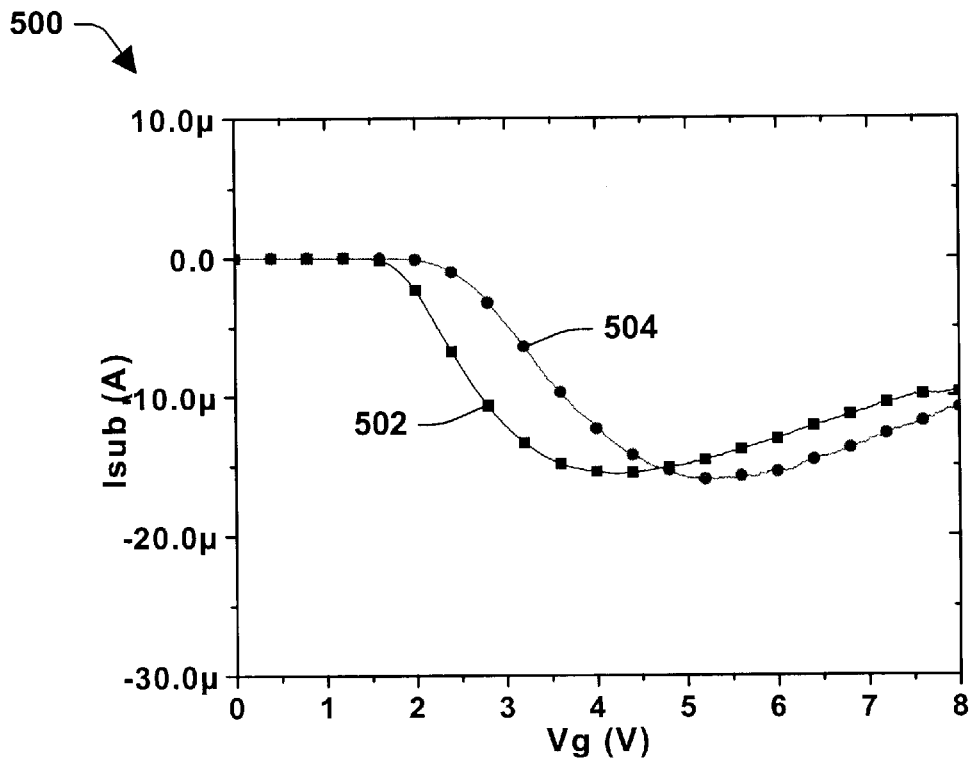
FIG. 5A is a plot illustrating the effect of programming and erase stress on portions of the tunnel oxide near the source of the device of FIG. 3A.
Figure 5B:
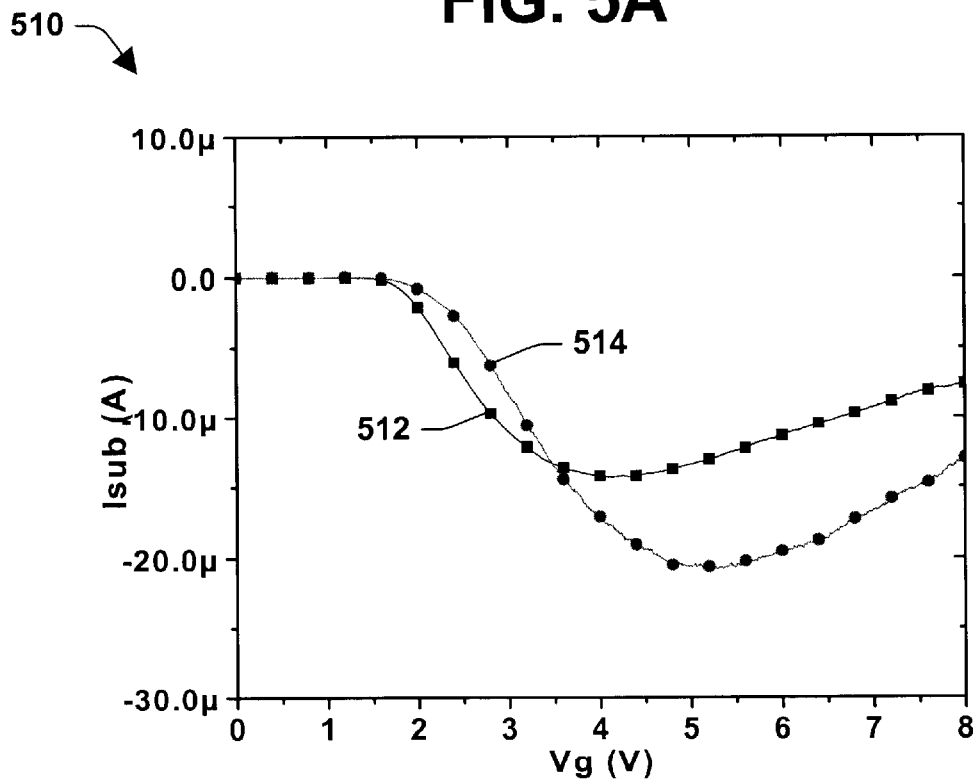
FIG. 5B is a plot illustrating the effect of programming and erase stress on portions of the tunnel oxide near the drain of the device of FIG. 3A.

Referring also to FIGS. 5A and 5B, plots 500 and 510 illustrate the effect of program and erase stresses on portions of the tunnel oxide 206 near the source 200b and the drain 200a, respectively, of the exemplary flash memory cell 200 of FIG. 3A. In the plot 500 of FIG. 5A, a first current versus voltage curve 502 illustrates pre-stress operation of the device 200 for various gate voltages with the drain 200a grounded and the source 200b held at about 4.25 volts. A second curve 504 in the plot 500 illustrates the flash cell operation following the erase and program stresses applied in accordance with the invention. As can be seen, the stresses cause a shifting (increase) in the threshold voltage as well as a slight decrease in the sub-threshold slope.

However, as noted above with respect to FIGS. 3B and 3C, the tunnel oxide 206 in the device 200 suffers greater degradation near the drain 200a (e.g., in region 216) than near the source 200b. Thus, as shown in FIG. 5B, the pre-stress curve 512 is similar to curve 502 of FIG. 5A, while the post-stress curve 514 shows the additive nature of the erase and program stresses at the drain side of the tunnel oxide 206 of the device 200. In this regard, it is noted that the primary transition of electrons from the channel to the floating gate 208 (FIG. 3B) during programming is near the drain 200a. Thus, the effects of the programming and erase stresses can cause more severe charge loss capability to the drain side region 216 of the tunnel oxide 206 than to the source side.

Figure 6:
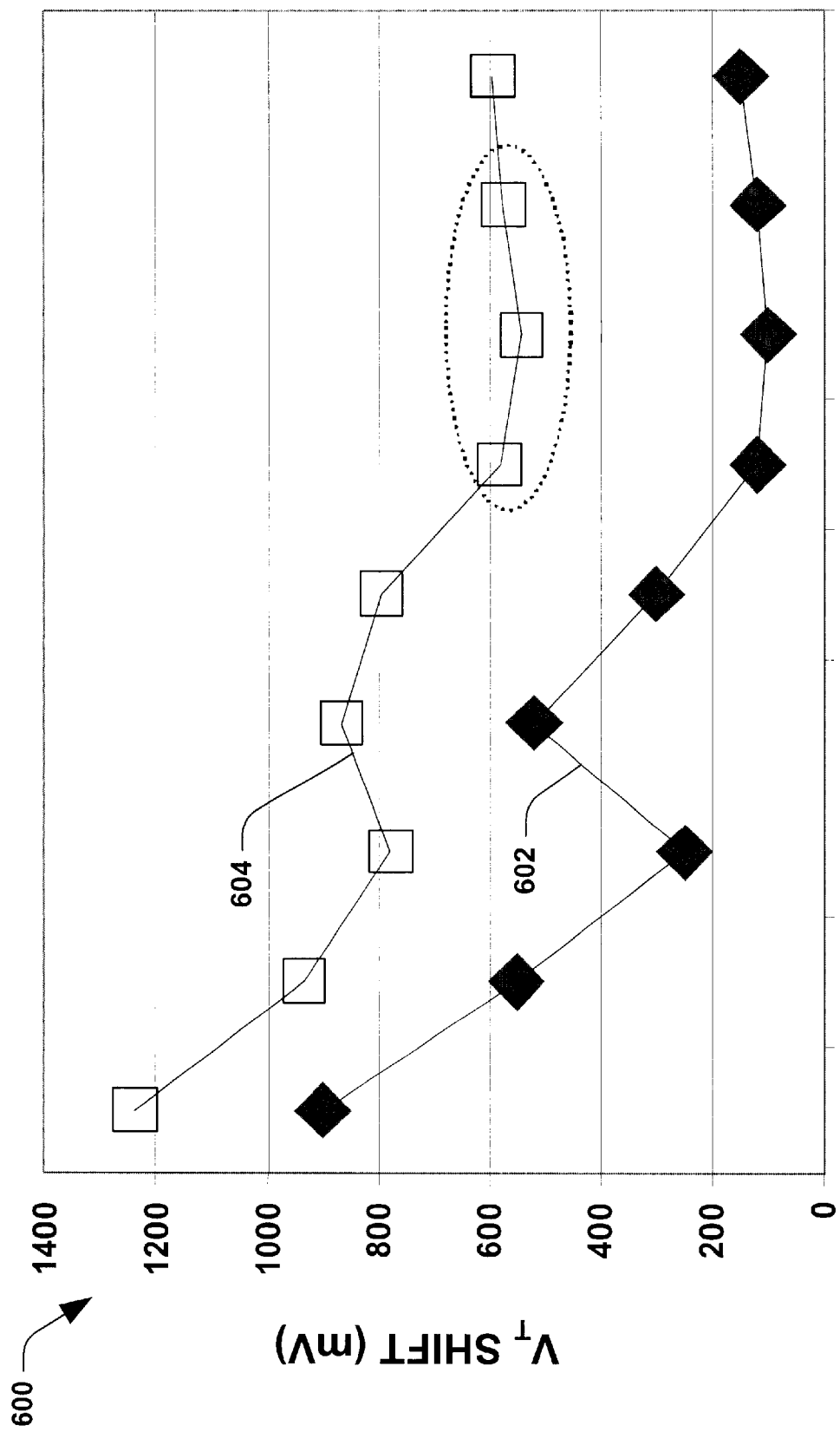
FIG. 6 is a plot illustrating test data comparing a conventional program/erase cycle test with tests performed according to the invention, wherein the equivalence of the program and erase stresses thereof can be correlated.

FIG. 6 illustrates a plot 600 of exemplary test data obtained using the methods of the present invention, as well as the conventional repeat program/erase cycling test (e.g., FIG. 1) for flash memory devices employing a channel type erase technique as shown above in FIG. 3C. The plot 600 illustrates a first curve 602 of threshold voltage shifts for devices tested and stressed according to the conventional method 2 of FIG. 1, and a second curve 604 of threshold voltage shifts for devices tested according to the invention. The plot 600 illustrates a correlation between a first curve 602 and the second curve 604, by which a determination can be made as to the acceptability of tunnel oxide performance in flash memory devices. Thus, where it is desirable to accept only devices showing a threshold voltage shift of less than about 200 mv for the repeated program/erase technique, an equivalent acceptance value (e.g., about 600 mv or less in the illustrated example) may be used where the devices are tested according to the present invention, wherein the best performing device results are circled in FIG. 6.

It is thus seen from FIG. 6 that the invention may be advantageously employed to determine the acceptability of tunnel oxide performance in flash memory devices, wherein the testing according to the invention can be completed in seconds rather than days or weeks. Furthermore, the invention provides the capability for such testing prior to device separation, sorting, and packaging, whereby cost savings can be achieved by avoiding such costs with respect to rejected devices. Furthermore, the tests of the present invention may be carried out at room temperature, for example, in association with other "probe" testing of processed wafers, whereas the conventional tunnel oxide reliability tests were performed at an elevated temperature (e.g., 90 degrees C.). Thus, it will be appreciated that the invention may be employed so as to provide significant advantages over conventional flash memory tunnel oxide reliability testing techniques and systems.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method for testing tunnel oxide reliability of flash memory devices in a semiconductor wafer, comprising:
   measuring an initial threshold voltage associated with a flash memory cell in the semiconductor wafer;
   applying a first stress to a tunnel oxide of the flash memory cell for a first time period, application of the first stress for the first time period being equivalent to N erase operations, N being an integer greater than 1;
   applying a second stress to the tunnel oxide of the flash memory cell for a second time period, application of the second stress for the second time period being equivalent to N program operations;
   measuring a final threshold voltage associated with the flash memory cell following the first and second stresses; and
   determining a tunnel oxide reliability for flash memory devices in the semiconductor wafer according to the initial and final threshold voltages.

2. The method of claim 1, wherein the first time period is about 400 ms, the second time period is about 100 ms, and N is about 100,000.

3. The method of claim 1, wherein determining the tunnel oxide reliability comprises calculating a threshold voltage shift as a difference between the initial and final threshold voltages and comparing the threshold voltage shift to an acceptance value.

4. The method of claim 3, wherein the acceptance value is representative of a threshold voltage shift corresponding to an acceptable tunnel oxide degradation for flash memory devices in the semiconductor wafer after N erase operations and N program operations.

5. The method of claim 4, comprising selectively rejecting the flash memory devices in the semiconductor wafer if the threshold voltage shift is greater than the acceptance value.

6. The method of claim 1, comprising selectively rejecting the flash memory devices in the semiconductor wafer if a difference between the initial and final threshold voltages is greater than an acceptance value.

7. The method of claim 1, wherein applying the first stress to the tunnel oxide of the flash memory cell comprises applying a positive erase substrate voltage to a substrate of the semiconductor wafer and applying a negative test voltage to a gate of the flash memory cell for the first time period.

8. The method of claim 7, wherein applying the first stress to the tunnel oxide of the flash memory cell comprises determining the negative test voltage as a voltage at which a current through a capacitor on the semiconductor wafer equals a first current value, wherein the capacitor is formed using a tunnel oxide equivalent to tunnel oxide of the flash memory cell.

9. The method of claim 8, wherein determining the negative test voltage comprises:

applying the positive erase substrate voltage to the substrate;

applying a negative voltage to the capacitor;

measuring the current through the capacitor; and changing the negative voltage until the current through the capacitor equals the first current value.

10. The method of claim 7, wherein applying the positive erase substrate voltage to the substrate and applying the negative test voltage to the gate for the first time period comprises applying about 9.3 volts to the substrate and applying about −8 volts to the gate for the first time period.

11. The method of claim 10, the first time period is about 400 ms and N is about 100,000.

12. The method of claim 7, wherein applying the second stress to the tunnel oxide of the flash memory cell comprises applying a positive program drain voltage to a drain of the flash memory cell, applying a positive program gate voltage to the gate of the flash memory cell, and grounding a source of the flash memory cell for the second time period.

13. The method of claim 12, wherein applying the second stress to the tunnel oxide of the flash memory cell comprises applying about 4.25 volts to the drain of the flash memory cell, applying about 5.5 volts to the gate of the flash memory cell, and grounding the source of the flash memory cell for the second time period.

14. The method of claim 13, wherein the second time period is about 100 ms and N is about 100,000.

15. The method of claim 12, wherein determining the tunnel oxide reliability comprises calculating a threshold voltage shift as a difference between the initial and final threshold voltages and comparing the threshold voltage shift to an acceptance value.

16. The method of claim 15, wherein the acceptance value is representative of a threshold voltage shift corresponding to an acceptable tunnel oxide degradation for flash memory devices in the semiconductor wafer after N erase operations and N program operations.

17. The method of claim 1, wherein applying the second stress to the tunnel oxide of the flash memory cell comprises applying a positive program drain voltage to a drain of the flash memory cell, applying a positive program gate voltage to the gate of the flash memory cell, and grounding a source of the flash memory cell for the second time period.

18. The method of claim 17, wherein applying the second stress to the tunnel oxide of the flash memory cell comprises applying about 4.25 volts to the drain of the flash memory cell, applying about 5.5 volts to the gate of the flash memory cell, and grounding the source of the flash memory cell for the second time period.

19. A method of estimating tunnel oxide reliability of flash memory devices in a wafer, comprising:

providing a test cell having a source, a drain, and a channel in a substrate of the wafer, a gate, and a tunnel oxide separating the channel from the gate;

applying an erase stress to a tunnel oxide of the test cell equivalent to N erase operations, N being an integer greater than 1;

applying a program stress to the tunnel oxide of the test cell equivalent to N program operations;

measuring a threshold voltage shift associated with application of the erase and program stresses to the test cell; and estimating a tunnel oxide reliability for flash memory devices in the wafer according to the threshold voltage shift.

20. A system for testing tunnel oxide reliability of flash memory devices in a wafer, comprising:

a test circuit operable to apply an erase stress to a tunnel oxide of a test cell equivalent to N erase operations and to apply a program stress to the tunnel oxide of the test cell equivalent to N program operations, N being an integer greater than 1;

means for measuring a threshold voltage shift associated with the test cell; and means for selectively accepting or rejecting the flash memory devices in the wafer according to the threshold voltage shift.

21. The system of claim 20, wherein the means for selectively accepting or rejecting the flash memory devices comprises a comparator operable to compare the threshold voltage to an acceptance value.

* * * * *